United States Patent
Stum et al.

(10) Patent No.: US 8,815,721 B2
(45) Date of Patent: Aug. 26, 2014

(54) SEMICONDUCTOR DEVICE AND METHOD OF MANUFACTURING THE SAME

(75) Inventors: Zachary Matthew Stum, Niskayuna, NY (US); Stephen Daley Arthur, Glenville, NY (US); Kevin Sean Matocha, Rexford, NY (US); Peter Almern Losee, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 12/971,188

(22) Filed: Dec. 17, 2010

(65) Prior Publication Data

US 2012/0153362 A1    Jun. 21, 2012

(51) Int. Cl.
*H01L 21/425*    (2006.01)
*H01L 21/04*    (2006.01)
*H01L 29/66*    (2006.01)
*H01L 29/78*    (2006.01)

(52) U.S. Cl.
CPC ........ *H01L 21/046* (2013.01); *H01L 29/66068* (2013.01); *H01L 29/7827* (2013.01)
USPC ............ 438/527; 438/197; 438/199; 257/288

(58) Field of Classification Search
USPC .......................... 438/197, 199, 527; 257/288
See application file for complete search history.

(56) References Cited

U.S. PATENT DOCUMENTS

| | | | |
|---|---|---|---|
| 6,054,352 A * | 4/2000 | Ueno | 438/268 |
| 6,956,238 B2 * | 10/2005 | Ryu et al. | 257/77 |
| 7,507,999 B2 | 3/2009 | Kusumoto et al. | |
| 7,790,616 B2 | 9/2010 | Buchoff et al. | |
| 2009/0242901 A1 | 10/2009 | Matocha et al. | |
| 2010/0133620 A1 | 6/2010 | Richter | |

* cited by examiner

*Primary Examiner* — Timor Karimy
(74) *Attorney, Agent, or Firm* — Scott J. Asmus

(57) ABSTRACT

A method comprising, introducing a dopant type into a semiconductor layer to define a well region of the semiconductor layer, the well region comprising a channel region, and introducing a dopant type into the well region to define a multiple implant region substantially coinciding with the well region but excluding the channel region.

19 Claims, 5 Drawing Sheets

500

502

Introducing, via a first region comprising a first dopant type of a semiconductor substrate, substantially into a portion of a second region comprising a second dopant type and a channel region of the semiconductor substrate, a second dopant type to define a third region of the semiconductor substrate in a manner that the third region is segregated from the channel region

*Fig. 10*

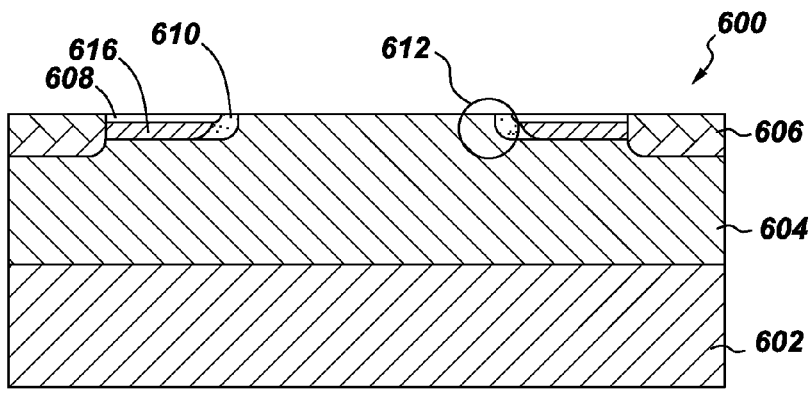

*Fig. 11*

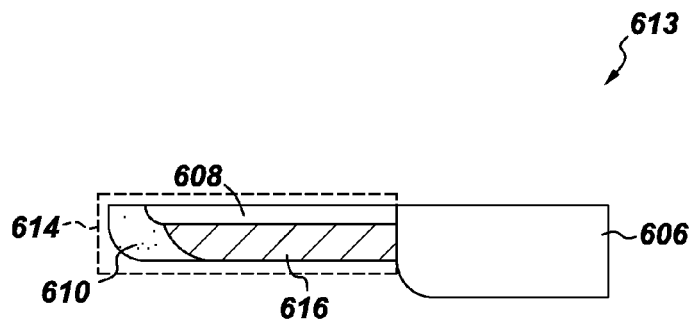

*Fig. 12*

SEMICONDUCTOR DEVICE AND METHOD OF MANUFACTURING THE SAME

BACKGROUND

Embodiments presented herein relate generally to the area of semiconductor devices. More specifically, embodiments presented herein relate to methods of manufacturing semiconductor devices, such as for instance, methods whereby an enhancement in manufacturing yield of semiconductor devices is achievable.

In a typical manufacturing process, for example, for a silicon carbide metal oxide semiconductor field effect transistor (MOSFET) device, the presence of a defect, for instance, in the p-well ion-implant process step, can lead to an electrical short between the source and the drain regions of the device, rendering the corresponding device useless.

The consequent loss of device manufacturing yield contributes to an increase in the cost per device of devices manufactured via such manufacturing processes.

A versatile and simple method that is capable of providing an enhancement in manufacturing yield of semiconductor devices, reducing thereby the cost per device, is therefore highly desirable.

BRIEF DESCRIPTION

Embodiments are directed to methods via which at least the presence of defects may be compensated for within extant semiconductor device fabrication process flows. Embodiments are also directed to semiconductor devices obtainable via said methods.

A method comprising, introducing a dopant type into a semiconductor layer to define a well region of the semiconductor layer, the well region comprising a channel region, and introducing a dopant type into the well region to define a multiple implant region substantially coinciding with the well region but excluding the channel region.

A method comprising, introducing, via a first region comprising a first dopant type of a semiconductor layer, substantially into a portion of a second region comprising a second dopant type and a channel region of the semiconductor layer, a second dopant type to define a third region of the semiconductor layer in a manner that the third region is segregated from the channel region.

A device comprising, a semiconductor layer comprising, a first region comprising a first dopant type, a second region adjacent the first region comprising a second dopant type and a channel region, and a third region comprising a second dopant type segregated from the channel region, wherein the third region substantially coincides with the second region.

These and other advantages and features will be more readily understood from the following detailed description of embodiments that is provided in connection with the accompanying drawings.

DRAWINGS

FIG. 10 shows a method, in accordance with one embodiment.

FIG. 11 shows an example semiconductor device, in accordance with one embodiment.

FIG. 12 shows an inset portion of the example semiconductor device shown in FIG. 11, in accordance with one embodiment.

DETAILED DESCRIPTION

In the following description, whenever a particular aspect or feature of an embodiment is said to comprise or consist of at least one element of a group and combinations thereof, it is understood that the aspect or feature may comprise or consist of any of the elements of the group, either individually or in combination with any of the other elements of that group.

As described in detail below, embodiments presented herein are directed to methods for obtaining improved semiconductor device yield from semiconductor device fabrication process flows (SDFPFs). The methods proposed here may be capable of ready implementation within extant SDFPFs, and this may represent one of the industrial benefits of said methods. Semiconductor devices obtainable via said methods are also described in detail below.

Masking layers are routinely disposed and etched away according to specific protocols on semiconductor layers during SDFPFs. An important cause of diminution in semiconductor device yield from extant SDFPFs is their inability to adequately control the number of defects that manifest during the etching away of the various masking layers. Other scenarios in which defects may manifest include the presence of a dust or otherwise unwanted particle on the semiconductor layer. Such unwanted particles serve as unwanted masking layers hindering the obtainment of proper and desired results from individual steps of the SDFPF. Quite generally therefore, the presence of any unwanted particle or region, whether caused due to an inadequacy in the execution of a step of the SDFPF, or due to the environment of the semiconductor layer, or chance effects, represents a defect and results in a burden on the semiconductor device yield obtainable from the SDFPF.

Figure 1:
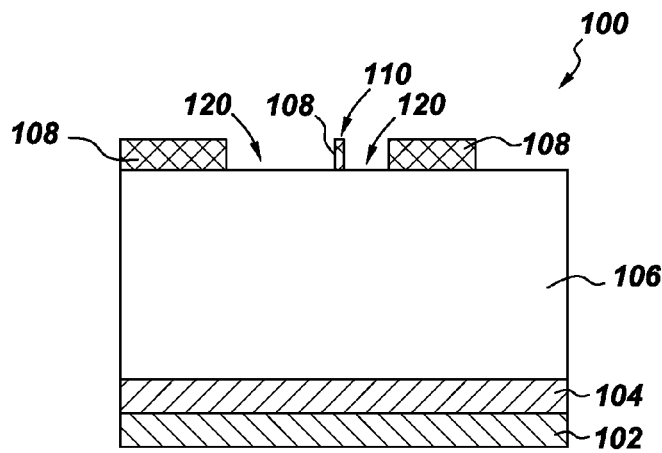
FIG. 1 shows a snapshot in time of one stage of an example semiconductor device fabrication process flow, in accordance with one embodiment.
Figure 2:
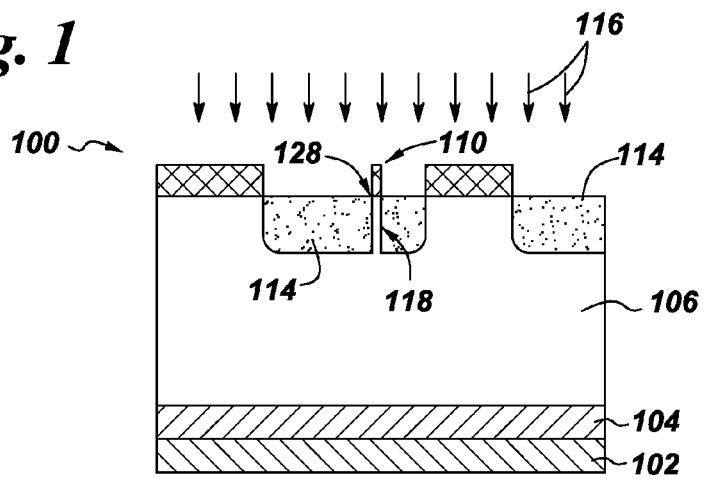
FIG. 2 shows a snapshot in time of another stage of an example semiconductor device fabrication process flow, in accordance with one embodiment.
Figure 3:
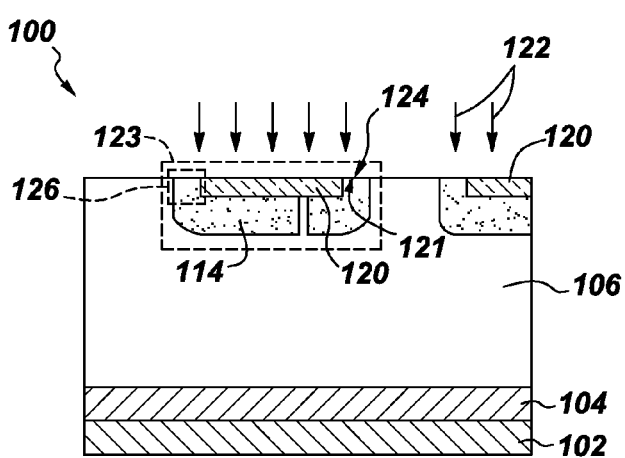
FIG. 3 shows a snapshot in time of yet another stage of an example semiconductor device fabrication process flow, in accordance with one embodiment.

In order to illustrate how defects may arise within a SDFPF, consider FIG. 1, FIG. 2, and FIG. 3, wherein are shown snapshots in time of different stages of an example SDFPF 100. The FIGS. 1-3 denote progression between stages of the depicted SDFPF, but it is clarified that stages shown in FIGS. 1-3 may not be successive stages of the SDFPF 100. The in process semiconductor device shown in FIG. 1 as it flows through the various stages of the SDFPF 100 includes various layers 102, and 104, the purposes of which layers would be ascertainable by one of skill in the art. In particular, the in process semiconductor device shown in FIG. 1 includes an n-drift layer 106, wherein is desired to be created, say, a p-well region via, say, an ion implantation process. Principles and techniques of ion implantation processes would be known to one of skill in the art. FIG. 1 also shows a masking layer 108 that has been partially etched away. In particular, FIG. 1 shows a portion 110 of the masking layer 108, which portion 110 remains undesirably on top of n– drift layer 106 within region 112, due in one instance, to a faulty execution of a previously performed etching step whereby it was attempted to remove portions of the masking layer which occupied region 112 on top of the n– drift layer 106. In other words, the desired outcome at the end of the etching step was that the portion of the masking layer 108 occupying region 112 on top of the n– drift layer 106 be removed in its entirety. However, due various unforeseen and often uncontrollable reasons which would be appreciated by one of skill in the art, a portion 110 of the masking layer 108 remains on top of the n– drift layer 106 within region 112 upon the completion of the etching step.

Figure 4:
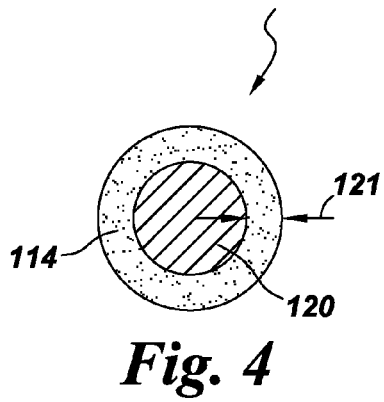
FIG. 4 shows a snapshot in time of one further stage of an example semiconductor device fabrication process flow, in accordance with one embodiment.

FIG. 2 further shows the in process semiconductor device at another stage within of the SDFPF 100, wherein a p well region 114 has been created within the n– drift layer 106 after an ion implantation process 116. Evidently the presence of portion 110 of masking layer 108 during the implantation process 116 results in a defect 118 in the p well region 114. FIG. 2 further shows the in process semiconductor device further at another stage of the SDFPF 100, wherein a n+ region 120 has been created within the p well region 114 via an ion implantation process 122. Those of skill in the art would recognize that the n+ region 120 should be formed so that the physical boundary of the n+ region 120 is substantially contained within the physical boundary of the p-well region 114, in order to define a channel region 121 as is shown in FIG. 3. This is illustrated in FIG. 4 with the help of transverse cross section top view 123 of the n– drift layer 106 wherein is shown the channel region 121. Those of skill in the art would be aware that satisfactory operation of the final finished semiconductor device obtained from the SDFPF 100 would depend, among other factors, on the integrity of the surface 124 of the channel region 121, and of the bulk region 126 of the p well region 114 in the vicinity of the surface of the channel region 121. All fabrication steps of the SDFPF that follow the step of creation of the p well region 114 may therefore be performed in a manner that the integrity of the surface 124 of the channel region 121, and of the bulk region 126 of the p well region 114 in the vicinity of the surface of the channel region 121, may not be compromised.

Evidently, an undesirable electrical short 128 exists between the n+ region 120 and the n– drift layer 106. The existence of the electrical short 128 is a result of (that is, traces back to) the defect 118 in the p well region 114, which defect 118 was created due to presence of portion 110 of masking layer 108. Evidently, the presence of electrical short 128 will likely render the final finished semiconductor device that is obtained from the SDFPF 100 unable to perform its intended function satisfactorily, resulting thereby in reduction in device yield obtained from the SDFPF 100.

Quite generally therefore, the presence of defects (for instance, of type 118) regardless of the cause of their creation, would result in a diminution of the semiconductor device yield obtainable from an SDFPF, resulting in turn, in increased cost per unit working semiconductor device that is obtained from the SDFPF.

Figure 5:
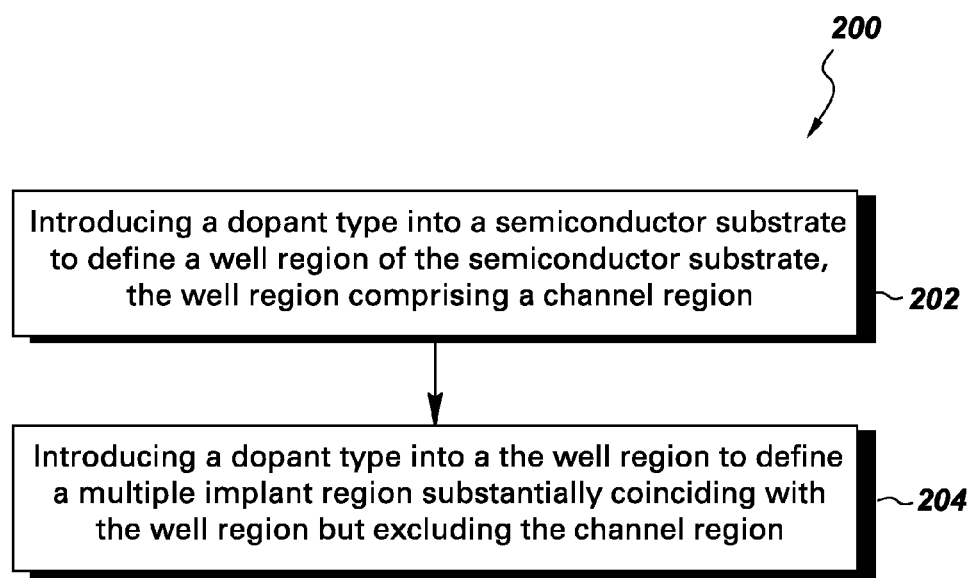
FIG. 5 shows a method, in accordance with one embodiment.

In accordance with one embodiment therefore, is proposed a method 200, depicted via flow chart representation in FIG. 5, via which at least the presence of defects (for instance, of type 118) may be compensated for, so that an enhancement in device yield obtainable from extant SDFPFs (for instance, SDFPF 100 depicted in FIG. 1) is possible. Method 200 can include introducing, at 202, a dopant type into a semiconductor layer (for instance, of type 106) to define a well region (for instance, of type 114) of the semiconductor layer, the well region including a channel region (for instance, of type 121). In one embodiment, method 200, at 202, may include introducing a p-type dopant type into the semiconductor layer. Suitable examples of p-type dopant type would be known to one of skill in the art. The method 200 can further include introducing, at 204, a dopant type into the well region to define a multiple implant region substantially coinciding with the well region but excluding the channel region. In one embodiment, method 200 may, at 202 and at 204, include introducing a dopant type into the well region of polarity same as the polarity of the dopant type introduced into the semiconductor layer. That is, the dopant type as recited at 202, and the dopant type as recited at 204, may both be p-type, or both may be n-type.

In one embodiment method 200 at 202 may include introducing a dopant type into the semiconductor layer so that the resultant concentration of the dopant type within the semiconductor layer is up to about $1 \times 10^{18}/cm^3$. In another embodiment method 200 at 204 may include introducing a dopant type into the well region so that the resultant concentration of the dopant type within the multiple implant region is up to about $1 \times 10^{18}$ per centimeter cubed ($/cm^3$).

In one embodiment method 200 may include, at 204 the feature of introducing a dopant type in the well region with a dosage that lies between about 0.01 times to about 100 times the dosage of the dopant type introduced into the semiconductor layer at 202. In another embodiment method 200 may include, at 204 the feature of introducing a dopant type in the well region with a dosage that lies between about 0.1 times to about 10 times the dosage of the dopant type introduced into the semiconductor layer per step 202 of method 200. In yet another embodiment method 200 may include, at 204 the feature of introducing a dopant type in the well region with a dosage that lies between about 0.1 times to about 5 times the dosage of the dopant type introduced into the semiconductor layer per step 202 of method 200.

In one embodiment method 200 at 202 may include introducing a dopant type comprising a chemical species selected from the group consisting of aluminum, boron, nitrogen, and phosphorous. In one embodiment method 200 at 204 may include introducing a dopant type including a chemical species selected from the group consisting of aluminum, boron, nitrogen, and phosphorous.

In one embodiment method 200 may further include introducing a second dopant type into a portion of the well region to define an ohmic contact region. A non-limiting example of an ohmic contact region is the n+ region 412 (FIG. 4; see discussions below). In one embodiment method 200 at 204 may include introducing a dopant into the well region via the ohmic contact region. In yet another embodiment of the invention, method 200 at 204 may include introducing a dopant type into the well region via the ohmic contact region comprising a chemical species selected from the group consisting of aluminum, boron, nitrogen, and phosphorous.

Figure 6:
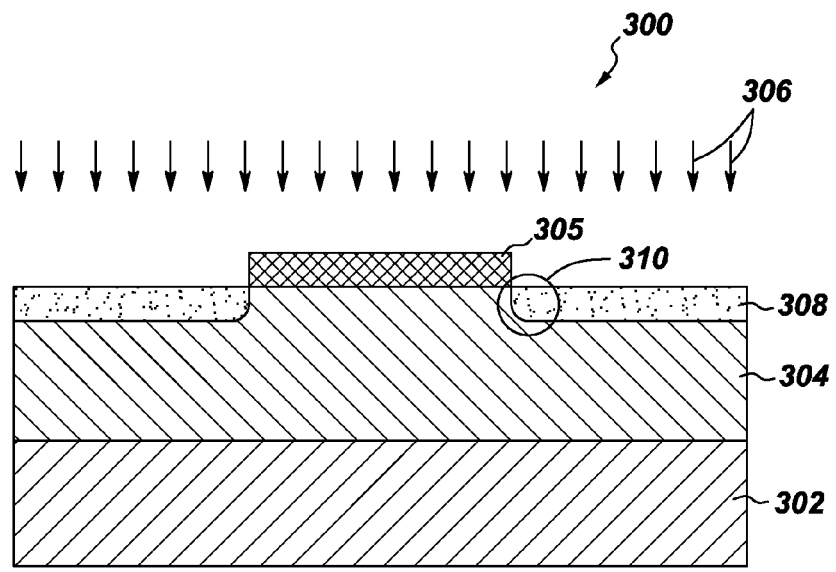
FIG. 6 shows an example implementation of the method shown in FIG. 5, in accordance with one embodiment.
Figure 7:
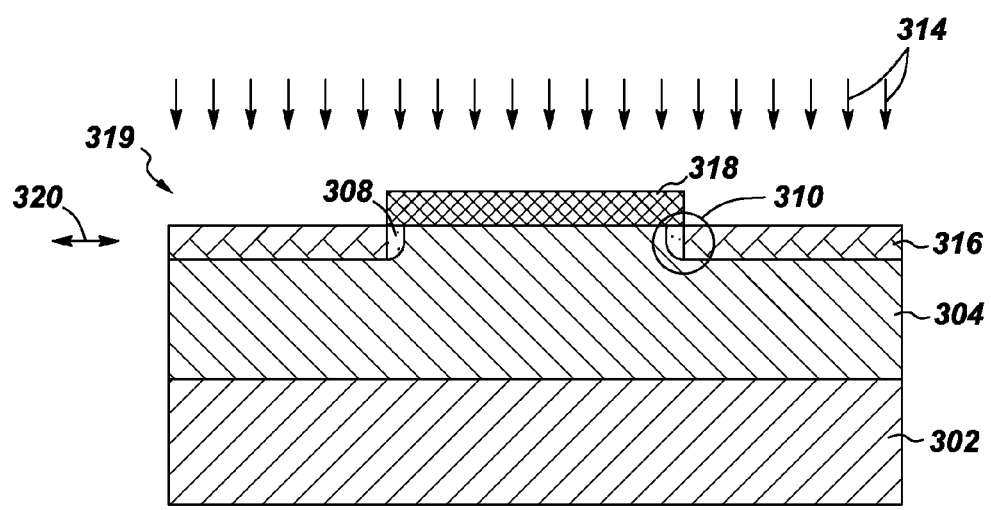
FIG. 7 shows another example implementation of the method shown in FIG. 5, in accordance with one embodiment.

FIG. 6 illustrates an example implementation 300 of method 200. FIG. 3 shows an example in process semiconductor device 301. The in process semiconductor device 301 can include a silicon carbide n+ layer 302 and an epitaxial silicon carbide n– drift layer 304. The purposes of the silicon carbide n+ layer 302 and the epitaxial silicon carbide n– drift layer 304 would be ascertainable by one of skill in the art. Furthermore, a masking layer 305 can be provided on top of the epitaxial silicon carbide n– drift layer 304. In accordance with one embodiment, an ion implantation process 306 is used to introduce a dopant type into the epitaxial silicon carbide n– drift layer 304 to define a p well region 308 according to patterns presented on the top surface of the epitaxial silicon carbide n– drift layer 304 by the masking layer 305. The p well region 308 can comprise a channel region 310. Subsequently (as shown in FIG. 7), in accordance with one embodiment, an ion implantation process 314 can be used to introduce a dopant type into the p well region 308 to define a multiple implant region 316 substantially coinciding with the p well region 308 but excluding the channel region 310 according to patterns presented on the top surface of the epitaxial silicon carbide n– drift layer 304 by an earlier disposed masking layer 318, to obtain an example in process semiconductor device 319.

Defects, for example, of type 118, if they were to manifest during the fabrication of a semiconductor device according to method 200, which defects would otherwise have resulted effectively in an undesirable extension of the epitaxial silicon carbide n– drift layer 304 within the p well region 308, may substantially be nullified. The defects, if they were present in that portion of the p well region 308 into which portion is introduced a dopant type to define the multiple implant region 316, would be substantially nullified, since the ingeminate introduction (e.g., at 204 of method 200) of dopant type into the p well region 308 would "fill up" the defect with said dopant type.

Furthermore, the masking layer 318 may be disposed upon the epitaxial silicon carbide n– drift layer 304 in a manner that it masks the channel region 310 during the ion implantation process. Without being limited by any particular scientific or engineering consideration, it is mentioned that the parameters of the ion implantation process 314 may be adjusted so as to ensure that the lateral straggle (substantially along direction 320) of the ions implanted does not penetrate into the channel region 310. In this context, it is mentioned that the multiple implant region 316 is to be defined so that the state of the electrical and physical environment within the channel region 310 remains substantially unaltered from its state before performance of the ion implantation process 314.

The above description of method 200 contemplates introducing a dopant type into the well region subsequent to introducing a dopant type into a semiconductor layer. However, in another embodiment, introducing a dopant type into the well region may be accomplished prior to introducing a dopant type into a semiconductor layer.

In one embodiment method 200, contemplates self aligning the n+ region 412 to the p well region 414 in order to form the channel 416. Self alignment may be performed according to methods which would be known to one of skill in the art.

Figure 8:
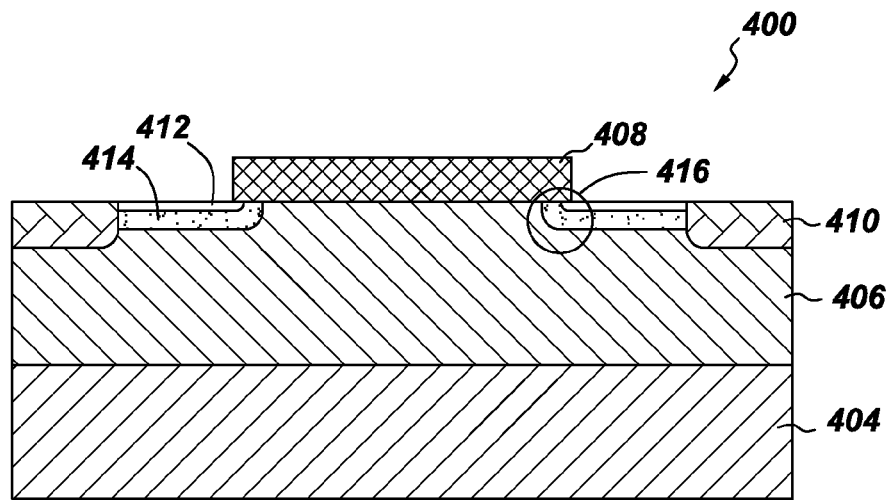
FIG. 8 shows an example implementation, in accordance with one embodiment.
Figure 9:
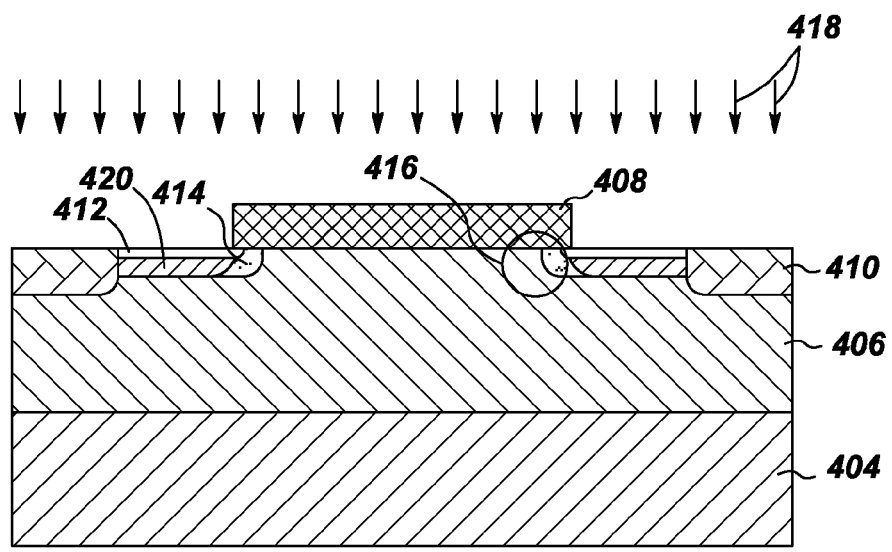
FIG. 9 shows another example implementation, in accordance with one embodiment.

FIG. 8 illustrates an example implementation 400 of a method not inconsistent with method 200 via which method at least the presence of defects (for instance, of type 118) potentially can be compensated for, so that an enhancement in device yield obtainable from extant SDFPFs (for instance, of the type depicted in FIG. 1) may be possible. FIG. 4 shows an example in process semiconductor device 402. The in process semiconductor device 402 can include a silicon carbide n+ layer 404 and an epitaxial silicon carbide n– drift layer 406. The purposes of the silicon carbide n+ layer 404 and the epitaxial silicon carbide n– drift layer 406 would be ascertainable by one of skill in the art. Furthermore, a masking layer 408 may be provided on top of the epitaxial silicon carbide n– drift layer 406. The epitaxial silicon carbide n– drift layer 406 may further include a p+ region 410 including a p-type dopant type, a n+ region 412 including an n-type dopant type, and a p well region 414 including a p-type dopant type. The p well region 414 includes a channel region 416. Subsequently (as shown in FIG. 9) An ion implantation process 418, can be used to introduce via the n+ region 412 and substantially according to patterns presented on the top surface of the epitaxial silicon carbide n– drift layer 406 by the masking layer 408, substantially into a portion of the p well region 414 a p-type dopant type to define a second p well region 420 of the epitaxial silicon carbide n– drift layer 406 in a manner that the second p well region 420 is segregated from the channel region 416. Further the masking layer 408 may be disposed upon the epitaxial silicon carbide n– drift layer 406 in a manner that it masks the channel region 416 during the ion implantation process 418. Without being limited by any particular scientific or engineering consideration, it is mentioned that the parameters of the ion implantation process 418 can be adjusted so as to ensure that the lateral straggle of the ions (substantially along direction 422) does not penetrate into the channel region 416. In this context, it is mentioned that the second p well region 420 may be defined so that the state of the electrical and physical environment within the channel region 416 remains substantially unaltered from its state before performance of the ion implantation process 418.

Quite generally therefore, in accordance with another embodiment of the invention, therefore, is proposed a method 500, depicted via flow chart representation in FIG. 10, via which at least the presence of defects (for instance, of type 118) can potentially be compensated for, so that an enhancement in device yield obtainable from extant SDFPFs (for instance, of the type depicted in FIG. 1) may be possible. Method 500 can include, at 502, the feature of introducing, via a first region (for instance, of type 412) including a first dopant type of a semiconductor layer (for instance, of type 406), substantially into a portion of a second region (for instance, of type 414) including a second dopant type and a channel region (for instance, of type 416) of the semiconductor layer, a second dopant type to define a third region (for instance, of type 420) of the semiconductor layer in a manner that the third region is substantially segregated from the channel region.

Defects, for example, of type 118, if they were to manifest during the fabrication of a semiconductor device according to method 500, which defects may otherwise have resulted in an undesirable extension of the epitaxial silicon carbide n– drift layer 406 substantially within the p well region 414, resulting in turn in effectively an electrical short (of type 128) between the epitaxial silicon carbide n– drift layer 406 and the n+ region 412, may substantially be nullified as follows. The defects, if they were present in that portion of the p well region 414 into which portion may, substantially according to method 500, be introduced, via the n+ region 412 substantially into a portion of the p well region 414 a dopant type to define the second p well region 420 would be substantially nullified, since said (substantially per method 500) ingeminate introduction of dopant type into the p well region 414 would potentially "fill up" the defect with said dopant type, potentially effectively rendering inoperative any electrical short between the epitaxial silicon carbide n– layer 406 and the n+ region 412. Those of skill in the art would recognize that, on an average, the semiconductor device yield obtainable via an SDFPF which incorporates performance of method 500, would be enhanced over the semiconductor device yield obtainable via an SDFPF which does not incorporate performance of method 500, by an amount that is substantially related to the volume of the p well region 414 that is occupied by the second p well region 420.

In one embodiment method 500 at 502 includes introducing, via a first region comprising a first dopant type of a semiconductor layer, substantially into a portion of a second region comprising a second dopant type and a channel region of the semiconductor layer, a second dopant type to define a third region of the semiconductor layer wherein the dosage of the dopant type introduced into the third region lies between about 0.01 times to about 100 times the dosage of the dopant type introduced into the second region.

FIG. 11 depicts an example semiconductor device 600 that may be fabricated according to the methods (for instance embodiments of methods 200, 400) disclosed herein. The semiconductor device 600 may include a silicon carbide n+ layer 602 and an epitaxial silicon carbide n− drift layer 604. The purposes of the silicon carbide n+ layer 602 and the epitaxial silicon carbide n− drift layer 604 would be ascertainable by one of skill in the art. The epitaxial silicon carbide n− drift layer 604 may include a p+ region 606 including a p-type dopant type. The epitaxial silicon carbide n− drift layer 604 further may include a n+ region 608 including an n-type dopant type. The epitaxial silicon carbide drift n− layer 604 further may include, adjacent the n+ region 608, a p well region 610 including a p-type dopant type and a channel region 612. The boundaries of the p well region are indicated with the help of inset 613 (FIG. 12) via reference numeral 614. The epitaxial silicon carbide n− drift layer 604 further may includes a second p well region 616 comprising a p-type dopant type segregated from the channel region 612, wherein the second p well region 616 substantially coincides with the p well region.

Quite generally, embodiments of the invention also include a device (for instance, of type 600) including, a semiconductor layer (for instance, of type 604) including, a first region (for instance, of type 608) including a first dopant type, a second region (for instance, of type 610) adjacent the first region comprising a second dopant type and a channel region (for instance, of type 612), and a third region (for instance, of type 614) including a second dopant type segregated from the channel region, wherein the third region substantially coincides with the second region.

Based on the discussions herein, those of skill in the art may appreciate that the performance of a final finished semiconductor device, obtained for instance via methods which substantially incorporate, for instance, method 200, may be compromised if an amount of dopant type within the well region, and/or the multiple implant region, is insufficient to produce, within said well region, and/or said multiple implant region, an electric field of magnitude substantially the magnitude of the critical electric field of the material from which is substantially made the semiconductor layer. For instance, in one embodiment, the amount of dopant within the region occupied by the well region, and/or the region occupied by the multiple implant region when the semiconductor layer is made up substantially of silicon carbide, should be sufficient to result in a charge density of about $1.3 \times 10^{13}$ cm$^2$ in order that the resultant electric field within the region occupied by the well region, and/or the region occupied by the multiple implant region approaches the critical electric field of silicon carbide. Similar discussions apply for the performance of a final finished semiconductor device, obtained for instance via methods which substantially incorporate, for instance, method 400.

In one embodiment the dopant type concentration within the third region may lie between about 0.01 times to about 100 times the dopant type concentration within the second region. In another embodiment of the invention, the dopant type concentration within the third region may lie between about 0.1 times to about 10 times the dopant type concentration within the second region. In yet another embodiment of the invention, the dopant type concentration within the third region may lie between about 0.1 times to about 5 times the dopant type concentration within the second region.

The embodiments described herein are examples of compositions, structures, systems and methods having elements corresponding to the elements of the invention recited in the claims. This written description may enable those of ordinary skill in the art to make and use embodiments having alternative elements that likewise correspond to the elements of the invention recited in the claims. The scope of the invention thus includes compositions, structures, systems and methods that do not differ from the literal language of the claims, and further includes other structures, systems and methods with insubstantial differences from the literal language of the claims. While only certain features and embodiments have been illustrated and described herein, many modifications and changes may occur to one of ordinary skill in the relevant art. The appended claims cover all such modifications and changes.

What is claimed as new and desired to be protected by Letters Patent of the United States is:

1. A method comprising:
    performing an initial ion implantation process to implant a first dopant type into a semiconductor layer to define a well region of the semiconductor layer, the well region comprising a channel region and a region for multiple ion implantation;
    disposing a mask over the channel region, wherein the mask does not extend over the region for multiple ion implantation; and
    performing a subsequent ion implantation process, while the mask is disposed over the channel region, to implant the first dopant type into the region for multiple ion implantation to define a multiple implant region substantially coinciding with the well region but excluding the channel region.

2. The method of claim 1, wherein the first dopant type comprises a p-type dopant type.

3. The method of claim 1, wherein a dosage for the subsequent ion implantation process lies between about 0.01 times to about 100 times a dosage for the initial ion implantation process.

4. The method of claim 1, wherein the first dopant type comprises at least one chemical species selected from the group consisting of aluminum, boron, nitrogen, and phosphorous.

5. The method of claim 1, wherein after performance of the initial ion implantation process, a resultant concentration of the first dopant type within the semiconductor layer is up to about $1 \times 10^{17}$ cm$^3$.

6. The method of claim 1, wherein after performance of the subsequent ion implantation process, the resultant concentration of the first dopant type within the multiple implant region is up to about $1 \times 10^{17}$ cm$^3$.

7. The method of claim 1, wherein the charge density in at least one of the well region or multiple implant region is about $1.3 \times 10^{13}$ cm$^{-2}$.

8. The method of claim 1, wherein the semiconductor layer is an n-type silicon carbide layer.

9. The method of claim 1, wherein a dosage for the subsequent ion implantation process lies between about 0.01 times to about 5 times a dosage for the initial ion implantation process.

10. A method comprising:
    performing an initial ion implantation process to implant a first dopant type into a semiconductor layer to define a well region of the semiconductor layer, the well region comprising a channel region and a region for multiple ion implantation;

introducing a second dopant type into a portion of the well region to define an ohmic contact region, wherein the first and second dopant types are different; and performing a subsequent ion implantation process via the ohmic contact region, to implant the first dopant type into the region for multiple ion implantation but not into the channel region, in order to define a multiple implant region substantially coinciding with the well region but excluding the channel region.

11. The method of claim 10, further comprising self aligning said ohmic contact region to said well region in order to form said channel region.

12. The method of claim 10, wherein the first dopant type comprises at least one chemical species selected from the group consisting of aluminum, boron, nitrogen, and phosphorous.

13. The method of claim 10, wherein the semiconductor layer further comprises a p+ region having p-type dopant.

14. The method of claim 10, wherein the ohmic contact region is an n+ region.

15. The method of claim 10, wherein a state of electrical and physical environment within the channel region remains substantially unaltered from its state before the subsequent ion implantation process.

16. A method for processing a semiconductor layer having a first region comprising a first dopant type, a second region comprising a second dopant type and a channel region, the method comprising:

introducing the second dopant type via the first region of the semiconductor layer, such that the second dopant type is introduced substantially into a portion of the second region and the channel region of the semiconductor layer, to define a third region of the semiconductor layer that is segregated from the channel region.

17. The method of claim 16, wherein a dosage of the second dopant type introduced into the third region lies between about 0.01 times to about 100 times the dosage of the second dopant type introduced into the second region.

18. A method for processing a silicon carbide layer having a n+ region comprising a n-type dopant, a first p well region comprising a p-type dopant, and a channel region, the method comprising:

performing ion implantation, via the n+ region, to implant the p-type dopant substantially into a portion of the first p well region and into the channel region, in order to define a second p well region of the silicon carbide layer in a manner such that the second p well region is segregated from the channel region.

19. The method of claim 18, wherein a dosage of the p-type dopant in the second p well region lies between about 0.01 times to about 100 times the dosage of the p-type dopant in the first p well region.

* * * * *